US011431150B2

(12) United States Patent
Hessenius et al.

(10) Patent No.: US 11,431,150 B2
(45) Date of Patent: Aug. 30, 2022

(54) EFFICIENT GENERATION OF SPATIALLY-RESTRUCTURABLE HIGH-ORDER HG-MODES IN A LASER CAVITY

(71) Applicant: Arizona Board of Regents on Behalf of the University of Arizona, Tucson, AZ (US)

(72) Inventors: Chris Hessenius, Tucson, AZ (US); Mahmoud Fallahi, Tucson, AZ (US); Michal L. Lukowski, Tucson, AZ (US)

(73) Assignee: Arizona Board of Regents on behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 17/432,307

(22) PCT Filed: Feb. 18, 2020

(86) PCT No.: PCT/US2020/018561
§ 371 (c)(1),
(2) Date: Aug. 19, 2021

(87) PCT Pub. No.: WO2020/172118
PCT Pub. Date: Aug. 27, 2020

(65) Prior Publication Data
US 2022/0045480 A1    Feb. 10, 2022

Related U.S. Application Data

(63) Continuation of application No. 16/682,284, filed on Nov. 13, 2019, now Pat. No. 10,992,108.
(Continued)

(51) Int. Cl.
*H01S 3/10* (2006.01)
*H01S 5/10* (2021.01)
(Continued)

(52) U.S. Cl.
CPC ............ *H01S 5/1021* (2013.01); *H01S 3/082* (2013.01); *H01S 3/0804* (2013.01);
(Continued)

(58) Field of Classification Search
CPC ...... H01S 5/1021; H01S 5/041; H01S 5/0604; H01S 5/0651; H01S 5/18361;
(Continued)

(56) References Cited

U.S. PATENT DOCUMENTS

| 5,590,147 A * | 12/1996 | Hobbs .................... H01S 3/0941 |
| | | 372/100 |
| 5,732,177 A * | 3/1998 | Deacon .................... G02F 1/035 |
| | | 385/129 |

(Continued)

FOREIGN PATENT DOCUMENTS

WO    2018118953 A1    6/2018

OTHER PUBLICATIONS

International Search Report and Written Opinion, issued in PCT/2020/18561 dated May 18, 2020 (19 pages).

*Primary Examiner* — Kinam Park
(74) *Attorney, Agent, or Firm* — Quarles & Brady LLP; Yakov S. Sidorin

(57) ABSTRACT

A vertical external cavity surface emitting laser (VECSEL) based system in a linear single cavity configuration is configured to deliver light in higher-order Hermite-Gaussian transverse modes with Watt-level output power. Simultaneous and independent lasing of spatially-restructurable multiple high-order transverse modes that are collinearly-propagating at the output of such laser cavity is facilitated with the use of an optical pumping scheme devised to control positions of location at which the gain medium of the system is pumped (e.g., locations of focal spots of multiple pump beams on the gain-medium chip). An external astigmatic
(Continued)

mode converter is utilized to convert such high-order Hermite-Gaussian modes into corresponding Laguerre-Gaussian modes.

18 Claims, 9 Drawing Sheets

Related U.S. Application Data

(60) Provisional application No. 62/807,349, filed on Feb. 19, 2019.

(51) Int. Cl.

| | | |
|---|---|---|
| *H01S 3/08* | (2006.01) | |
| *H01S 5/04* | (2006.01) | |
| *H01S 5/06* | (2006.01) | |
| *H01S 5/065* | (2006.01) | |
| *H01S 5/183* | (2006.01) | |
| *H01S 3/082* | (2006.01) | |
| *H01S 3/00* | (2006.01) | |
| *H01S 3/11* | (2006.01) | |
| *H01S 5/00* | (2006.01) | |
| *H01S 5/14* | (2006.01) | |
| *H01S 5/40* | (2006.01) | |

(52) U.S. Cl.
CPC .......... *H01S 3/08045* (2013.01); *H01S 5/041* (2013.01); *H01S 5/0604* (2013.01); *H01S 5/0651* (2013.01); *H01S 5/18361* (2013.01); H01S 3/0092 (2013.01); H01S 3/11 (2013.01); H01S 5/0092 (2013.01); H01S 5/141 (2013.01); H01S 5/183 (2013.01); H01S 5/4062 (2013.01); H01S 2301/20 (2013.01)

(58) Field of Classification Search
CPC .... H01S 5/18327; H01S 5/0092; H01S 5/183; H01S 3/0804; H01S 3/08045; H01S 3/082; H01S 3/0092; H01S 2301/20
See application file for complete search history.

(56) References Cited

U.S. PATENT DOCUMENTS

| | | | |
|---|---|---|---|
| 11,241,284 B1* | 2/2022 | Varghese | A61N 5/0616 |
| 2003/0151053 A1* | 8/2003 | Sun | H01S 3/0057 |
| | | | 257/E23.15 |
| 2010/0046562 A1* | 2/2010 | Donegan | H01S 5/0265 |
| | | | 372/20 |
| 2015/0092802 A1 | 4/2015 | Gronenborn et al. | |
| 2015/0357787 A1* | 12/2015 | Nguyen | H01S 3/0315 |
| | | | 372/93 |
| 2016/0241000 A1* | 8/2016 | Gronenborn | H01S 5/0608 |
| 2019/0216543 A1* | 7/2019 | Sierra | H01S 3/08018 |
| 2019/0312408 A1* | 10/2019 | Fallahi | H01S 5/041 |

* cited by examiner

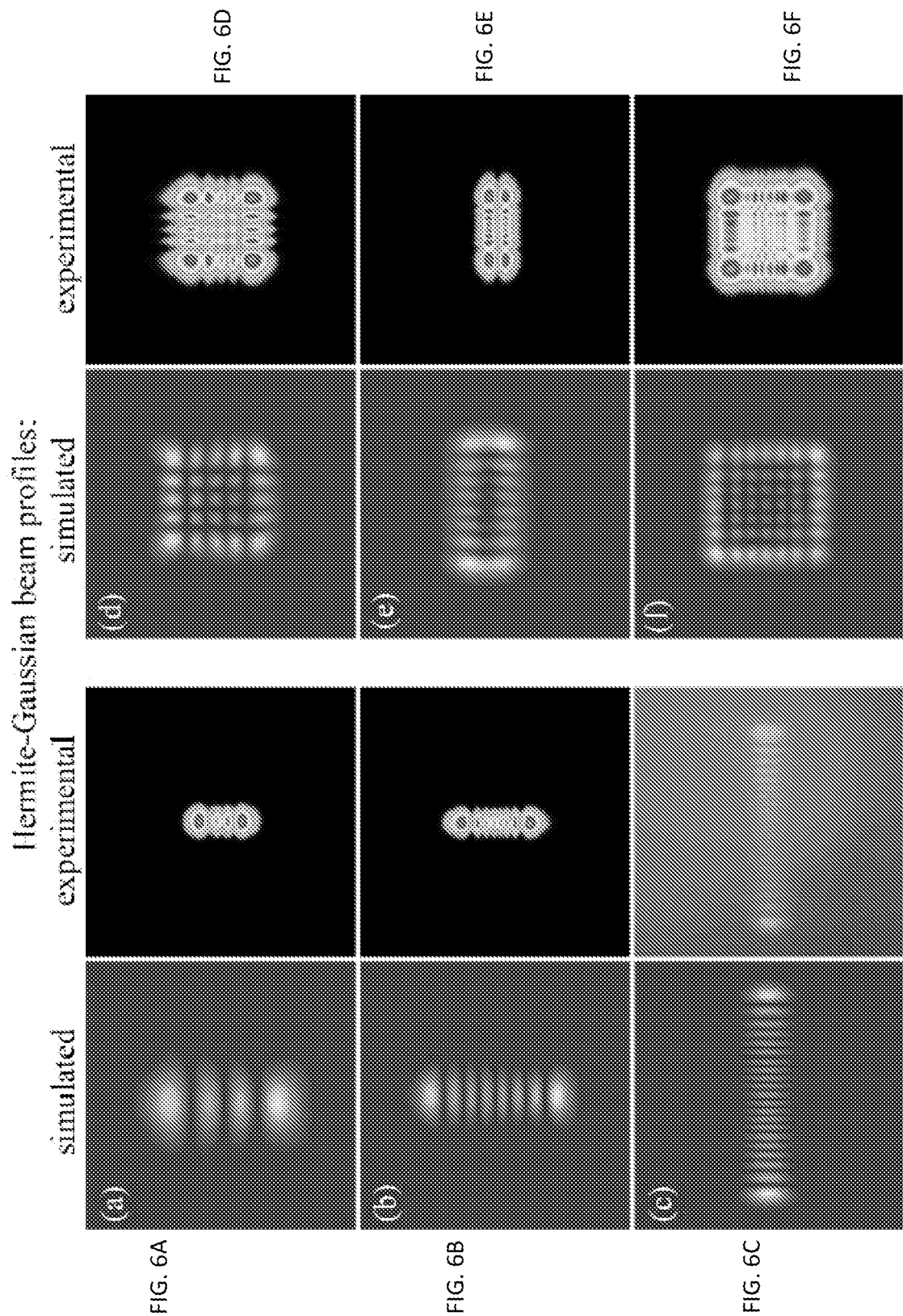

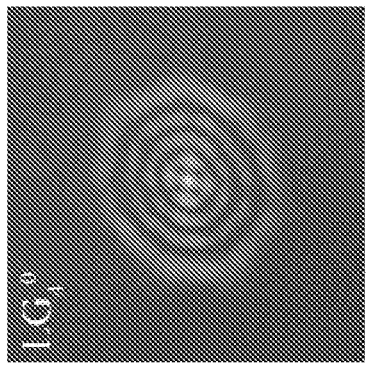
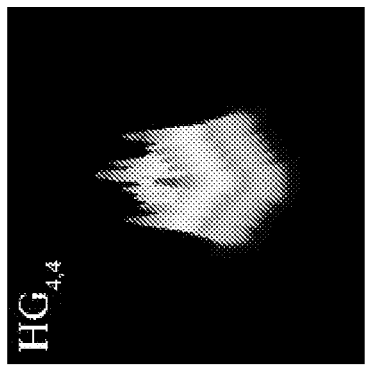
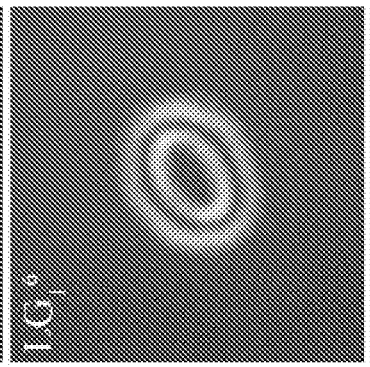
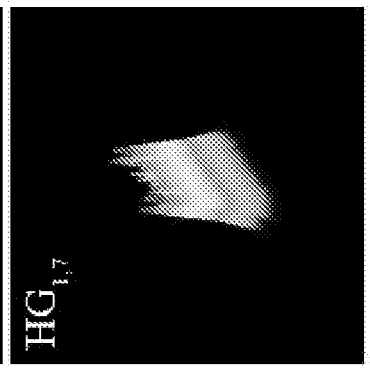
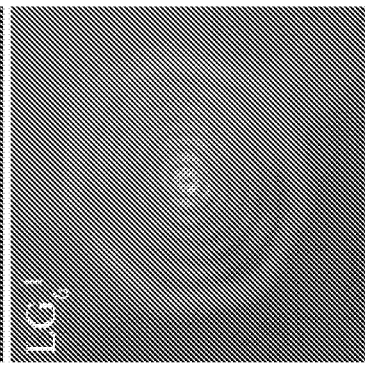
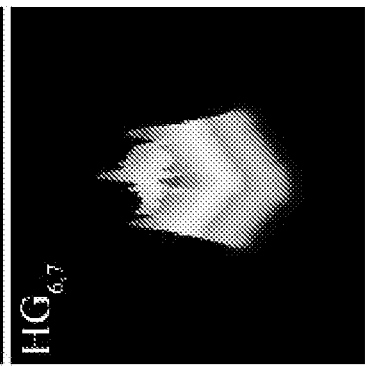
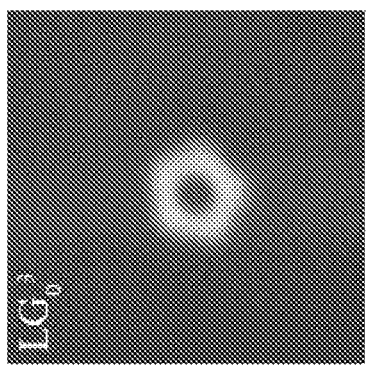
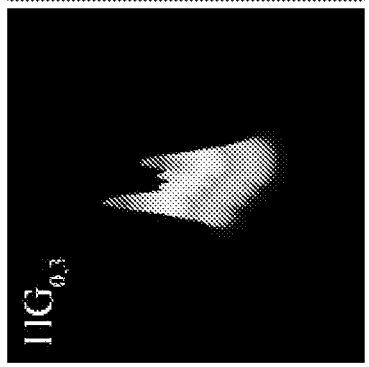
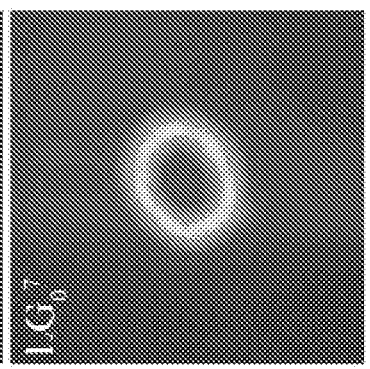
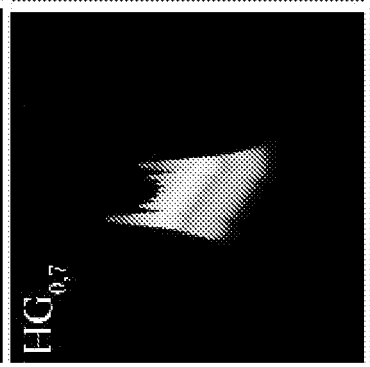
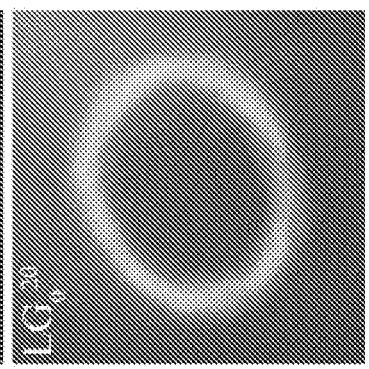
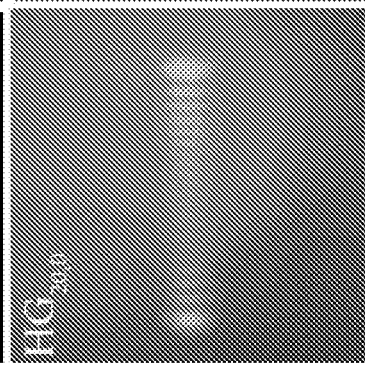
FIG. 7A FIG. 7B FIG. 7C FIG. 7D FIG. 7E FIG. 7F

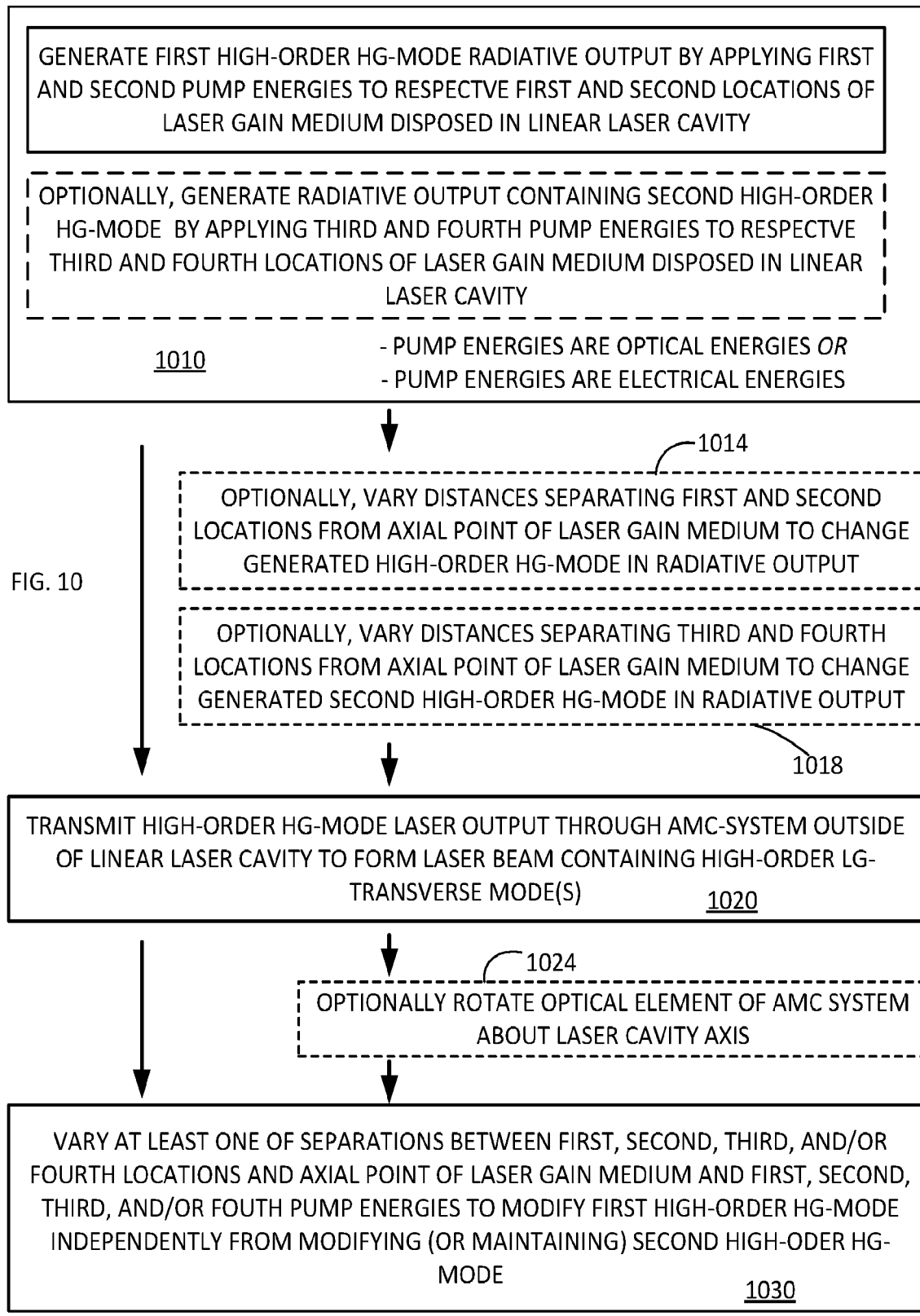

EFFICIENT GENERATION OF SPATIALLY-RESTRUCTURABLE HIGH-ORDER HG-MODES IN A LASER CAVITY

CROSS-REFERENCE TO RELATED APPLICATIONS

This application represents the US national stage entry from International Application No. PCT/US2020/018561, filed on 18 Feb. 2020, which claims priority from the U.S. Provisional Patent Application No. 62/807,349 filed on Feb. 19, 2019 and which is also a continuation-in-part from the U.S. patent application Ser. No. 16/682,284 filed on Nov. 13, 2019. The disclosure of each of the above-identified patent documents is incorporated by reference herein.

RELATED ART

Laser sources (or lasers, for short) structured to generate light with the spatial distribution of irradiance corresponding to higher-order Hermite-Gaussian (HG) or Laguerre-Gaussian (LG) modes have attracted significant interest due to broad ranges of applications in which such lasers can be employed. Both axially- and circularly-symmetric laser output beams with such spatial mode content can be utilized, for example, in atom and/or microparticle trapping, manipulation of biological cells, light-atom interactions, and nonlinear optics, to name just a few. The higher-order spatial mode output has been demonstrated previously from microlasers, optically pumped solid state lasers, and spatially-structured vertical cavity surface emitting laser systems (VCSELs that utilize, for example, spiral phase plates or astigmatic mode converters judiciously devised to alter HG modes). It is well recognized, however, that low output power and/or large device size limit or even detrimentally curb the wide use of these laser systems.

Optically-pumped vertical external cavity surface emitting lasers (referred to as VECSELs) that operate in a near-infrared (near-IR) spectral range are capable of delivering high-output power in a high-quality $TEM_{00}$ mode, while free-space cavity/ies—with which such lasers can be appropriately equipped—provide additional degrees of freedom for various transformative processes (such as wavelength tuning, nonlinear frequency conversion, and mode-locked operation, to name just a few). The ability to achieve lasing in a stable fundamental Gaussian beam profile has been one of the main advantages of VECSELs, therefore research has primarily been conducted with Gaussian beams.

While generation of HG and LG transverse modes using VECSELs with intracavity mode control element has been recently discussed in, for example, WO 2018/118953; in *Optics Express* 25, no. 21 (2017): 25504-25514 by Lukowski et al.; in *Applied Physics Letters* 112, no. 4 (2018): 041108 by Lukowski et al.; which publications are referred to as Our Prior Publications and incorporated herein by reference), all related art systems suffer from inability of generating radiation output with controlled and independently-utilized and/or changeable as desired by the user higher-order LG modes, as well as from the need to utilize a mode control element disposed inside the laser cavity.

SUMMARY OF THE INVENTION

Embodiments of the invention address industrial need in generation of laser output the transverse mode content of which includes independently-changeable multiple high-order HG- and/or LG-modes.

Implementations of the idea of the invention provide a laser system and a method for generating laser radiation in high-order transverse modes with the use of such laser system.

The laser system includes a laser cavity that is defined by first and second reflectors and has a laser cavity axis. The laser cavity includes a laser gain medium chip that contains the first reflector, while the second reflector is dimensioned to have a center of curvature of the second reflector at an axial point of the first reflector. (In at least one case, the first reflector is a distributed Bragg reflector (DBR) of the laser gain medium chip.) The laser system additionally includes multiple pump channels each configured to deliver pumping energy to the laser gain medium chip at a respectively-corresponding initial location of a surface of the laser gain medium chip in a fashion that allows for spatially-varying such initial location. Optionally, the laser system may be complemented with an astigmatic mode converter (AMC) system disposed outside of the laser cavity on the laser axis. (In a specific case, at least one of astigmatic optical elements of the AMC system is configured to be rotated about the laser axis.)

In substantially any implementation of the laser system the system may additionally include a mechanism configured to cause, during the operation of the laser system, a change of at least one of first and second of the initial locations (at which multiple pump channels deliver pumping energy to the gain medium chip) to such respectively-corresponding third and fourth locations that are symmetric about the laser cavity axis. When so structured, the laser system may be configured to satisfy at least one of the following conditions: a) the first and second of the initial locations (at which multiple pump channels deliver pumping energy to the gain medium chip) are positioned in the surface of the chip symmetrically with respect to the laser cavity axis; and b) the third and fourth locations are positioned in such surface symmetrically with respect to the laser cavity axis.

In substantially any implementation of the laser system, such mechanism may be configured to re-orient the multiple pump channels to change at least one of i) a first spatial separation between the axial point of the first reflector and at least one of locations in the first pair; and ii) a second spatial separation between the axial point of the first reflector and at least one of locations in the second pair-independently from one another.

Regardless of the specific implementation, the laser system may be configured such that a number of the initial locations (at which multiple pump channels deliver pumping energy to the gain medium chip) is even and such initial locations form pairs of initial locations. Here, initial locations in a first pair are defined on a first axis, initial locations in a second pair are defined on a second axis, and the first and second axes being transverse to one another. (In one specific case, the first and second axes are perpendicular to one another). Regardless of the specifics of the particular implementation, the laser system may be configured to be free of (devoid of, lack) an intracavity optical element that is a) disposed in said portion of the laser cavity and b) configured to introduce preferential optical loss to a given laser mode supported by said laser cavity.

In any embodiment, the laser cavity does not contain any intracavity element that is not a laser gain medium chip itself.

Embodiments of the invention additionally provide a method of operating the above-defined laser system. Such method includes (in reference to a portion of a laser cavity of the laser system, which portion has a longitudinal axis and is formed by a first reflector that is defined by a laser gain medium chip and a second reflector that has a non-zero curvature): a step of applying first pump energy to the laser gain medium chip at a first point of a surface of the laser chip and a step of applying second pump energy to the laser ship at a second point of said surface, to generate laser radiation in a first high-order Hermite-Gaussian transverse mode at an output of the laser cavity. Here, the first point and the second point are displaced from an axial point of the surface by a first distance and a second distance, respectively (the first and second distances measured along the surface of the chip).

The method may additionally include at least one of dimensioning the second reflector to have a center of said non-zero curvature at the axial point and configuring the first reflector to be a substantially planar reflector. (In the latter case, the surface of the laser chip may be configured as the first reflector).

In substantially any implementation, the use of the laser gain medium may include the use of a VECSEL laser chip. Alternatively or in addition, and in any embodiment, the method may further include transmitting the laser radiation (output from the laser cavity) through an astigmatic mode converter system that is disposed outside of the portion of the laser cavity, such as to transform the first high-order Hermite-Gaussian transverse mode generated at the output from the laser cavity to a corresponding first high-order Laguerre-Gaussian transverse mode. Alternatively or in addition, the step of applying the first pump energy to the laser gain medium chip may include focusing a first optical beam at the first point and the applying the second pump energy to the laser gain medium chip may include focusing a second optical beam at the second point. (Alternatively, the method step of applying the first pump energy may include injecting first current to the laser chip at the first point, and the method step of applying the second pump energy may include injecting second current to the laser chip at the second point.)

The method may also include at least one of (a) varying at least one of the first and second distances to change spatial distribution of irradiance in said first high-order Hermite-Gaussian mode, and (b) applying third pump energy to the laser chip at a third point of the surface and applying fourth pump energy to the laser ship at a fourth point of said surface to generate laser radiation in an auxiliary high-order Hermite-Gaussian transverse mode simultaneously with generation of laser radiation in said first high-order Hermite-Gaussian transverse mode, wherein the auxiliary high-order Hermite-Gaussian mode is different from the first high-order Hermite-Gaussian transverse mode. (Here, the third point and the fourth point are displaced from the axial point by a third distance and a fourth distance, respectively, the third and fourth distances measured in the surface; and when first and second points are located on a first axis and the third and fourth points are located on the second axis, the first axis is transverse to the second axis.)

In the latter implementation of the method, at least one of the following operational conditions is satisfied: a) at least one of the first and second distances is being varied; b) at least one of the third and fourth distances is being varied; c) at least one of the first and second pump energies is being varied; and d) at least one of the third and second pump energies is being varied—to modify a characteristic of one of the first high-order Hermite-Gaussian transverse mode and the auxiliary high-order Hermite-Gaussian mode while, at the same time, maintaining a characteristic of the other of the first high-order Hermite-Gaussian transverse mode and the auxiliary high-order Hermite-Gaussian mode. Alternatively or in addition, the method may additionally include varying a characteristic of one of the first high-order Hermite-Gaussian transverse mode and the auxiliary Hermite-Gaussian mode independently from varying a characteristic of the other of the first high-order Hermite-Gaussian transverse mode and the auxiliary Hermite-Gaussian mode by satisfying one of the following conditions; i) changing at least one of the first and second distances; ii) changing at least one of the third and fourth distances; iii) changing at least one of the first and second pump energies; and iv) changing at least one of the third and second pump energies.

In substantially any embodiment of the method, the process of generating laser light in high-order transverse modes may be configured to be devoid of using (inside the portion of the laser cavity) of such specific first optical element that is configured to introduce preferential optical loss to a chosen high-order transverse mode and/or of configuring the first reflector as a distributed Bragg reflector (DBR).

BRIEF DESCRIPTION OF THE DRAWINGS

The invention will be more fully understood by referring to the following Detailed Description of Specific Embodiments in conjunction with the not-to scale Drawings, of which:

FIGS. 6A, 6B, 6C, 6D, 6E, and 6F: Simulated and experimentally measured 2D profiles of various high-order Hermite-Gaussian modes, generated by an embodiment of the invention: (a) $HG_{0,3}$, (b) $HG_{0,7}$, (c) $HG_{20,0}$, (d) $HG_{4,4}$, (e) $HG_{1,7}$ and (f) $HG_{6,7}$.

FIGS. 7A, 7B, 7C, 7D, 7E, and 7F provide images of experimentally recorded high order Hermite-Gaussian modes generated by an embodiment of the invention and respectively-corresponding Laguerre-Gaussian modes produced with the use of the astigmatic mode converter.

FIG. 10 is a schematic block-scheme illustrating the method for operating the embodiment of the laser system of the invention.

Figure 1:
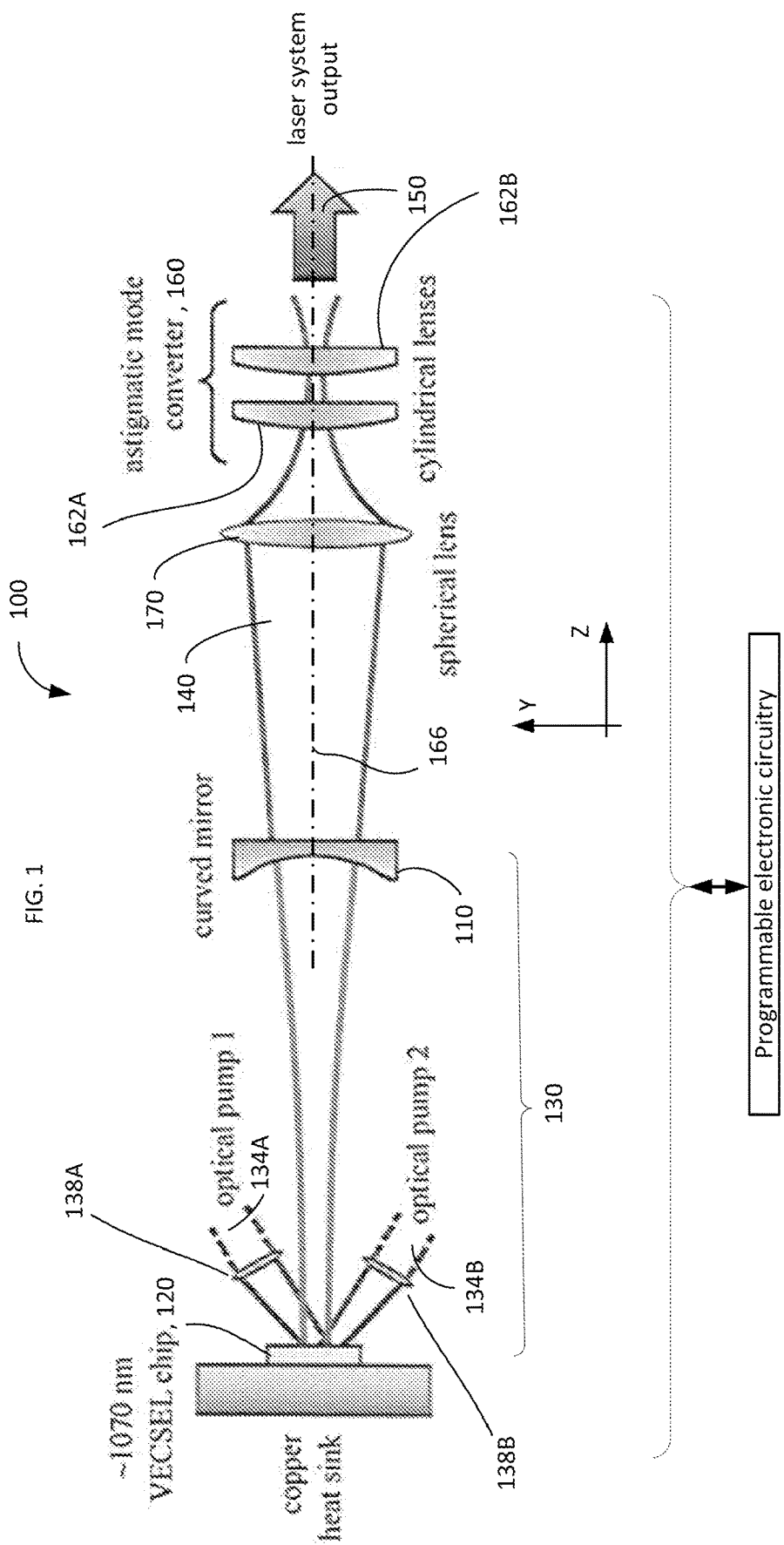
FIG. 1 is a schematic representing a structure of a linear cavity VECSEL apparatus equipped with an external astigmatic mode converter and employing two optical pump systems.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Implementations of the present invention provide a novel VECSEL-based laser system configured to generate laser radiation in pre-defined (and spatially-changeable, at a discretion of the user higher-order HG-modes and, when required, higher-order LG modes). The idea of the invention stems from the realization that such spatially-reconfigurable laser output can be achieved with the use of multiple fluxes of pump energy directed to the gain medium of the system that are spatially-reconfigurable with respect to the gain medium.

For over the past couple of decades, optically pumped vertical external cavity surface emitting lasers have been widely studied and proven to be reliable laser sources that deliver high brightness and high output powers over a wide spectral emission range. The flexibility of design and/or availability of semiconductor gain structures allowed for lasing operation in visible, near infrared and mid-infrared spectral regions. The so-called "open cavity designs" provided opportunities to achieve outstanding results in wavelength tunability, pulse generation, and nonlinear frequency conversion. While thus far mostly the $TEM_{00}$ mode output from a given laser system has been used, the exploration of VECSEL-based light sources with the purpose of generation of higher-order HG and LG modes has already been initiated. For example, as discussed in Our Prior Publications, an intracavity mode control element was successfully utilized to judiciously introduce loss for a non-desired HG laser mode, thereby creating favorable lasing conditions for a targeted higher-order transverse mode.

However, all related art laser systems known thus far share the inability to generate specific higher-order LG-modes that possess sought-after angular momentum and that can be controlled and utilized independently from one another. In other words, the laser systems of related art simply are not devised to allow for choosing the transverse mode content of the generated laser output and/or for tuning (or changing) such mode content at user's discretion. This practical problem is solved by implementing the idea of the present invention, in which generation of the pre-defined higher-order HG-modes with the VECSEL-based laser system is accomplished by equipping such laser system with multiple pump units (whether optical or electrical) that apply the pump energy(ies) to judiciously specified—and spatially changeable at the user's discretion—portions of the gain medium chip of VECSEL (as opposed to the whole gain medium in its entirety, as done during the operation of the laser systems of related art), and converting such user-reconfigurable HG-modes into the corresponding LG-modes outside of the laser cavity with the use of the external mode converter.

The implementations of the present idea make use of multiple, spatially-distinct from one another fluxes of pump energy—whether optical or electrical—delivered to and received by the gain medium at different and spatially-changeable, when desired, locations are the gain medium.

(In some specific examples discussed here, this principle is explained with the use of multiple optical pumps focused onto the surface of a VECSEL chip; the examples of using the optical pumps are not intended to be limiting as a skilled artisan will immediately appreciate the modifications of the system required for implementation of multiple electrical pump channels.) This method allows for substantially lossless (that is, with no intracavity elements present in the laser system) emission of tunable high quality, stable and Watt-level laser output containing HG modes, while at the same time maintaining the operational flexibility of open free-space laser resonator cavity. Moreover, utilization of multiple (as shown in one specific, non-limiting example—two) pumping channels or schemes allows for creation of multiple (in a specific example—two) independently generated and independently controlled at the user's discretion and collinearly propagating $HG_{m,0}$ or $HG_{0,m}$ modes within the same linear cavity—all with a single, one VECSEL gain medium chip. (As a skilled artisan readily recognizes, a linear optical cavity used in laser systems—or, the linear laser cavity—is an arrangement of laser reflectors configured to form a standing wave cavity resonator for light waves propagating intracavity. In forming the standing optical wave inside the cavity, and therefore being substantially an optical resonator formed between the two identified optical reflectors, the linear laser cavity is differentiated from, for example, a loop laser cavity.) The use of an external—that is, not intracavity—mode-matched astigmatic mode converter (AMC) allows to efficiently convert the generated HG modes into corresponding LG modes, which are accordingly also independently controlled and changed as a result of controlling the HG modes.

As a person of skill in the art will readily appreciate, the implementations of this invention—as opposed to laser systems of related art—utilize the laser cavity that is devoid of (that is, does not contain) an intracavity element configured to selectively apply losses to a chosen generated mode. Instead, the present embodiments attend to a different task of using an operationally-flexible and spatially-restructurable control of pumping conditions to efficiently and variably generate various HG modes of high orders, at various wavelengths including, for example, the wavelength(s) of about 940 nm, of about 970 nm, of about 1068 nm, and/or of about 1180 nm, to name just a few. (The principle of operation of implementations of the idea of the invention is presented below on the examples of VECSEL system operating at about 1068 nm.)

In particular, and according to an idea of the invention, an embodiment utilizes an empty linear cavity (that is, a linear cavity devoid of intracavity elements that are not the gain medium element itself) formed with the use of an output coupler and a VECSEL chip (the gain medium element, configured for laser emission at a chosen wavelength—in one example, at about 1068 nm) together with multiple spatially-distinct from one another pumping channels. The energy delivered along the multiple pumping channels is appropriately applied at the judiciously chosen locations at the VECSEL chip surface. In one example, the output coupler is configured, for example, as a curved reflector)

Notably, in operation of the so-devised laser scheme, the process of lasing of the targeted transvers HG modes experiences substantially no loss inside the laser resonator itself, and therefore gain provided by the pumping (whether optical or electrical) portion of the system is efficiently utilized to obtain a desired higher-order HG mode. Under some circumstances, an embodiment of the proposed laser system can be caused to operate by simultaneously generating multiple (for example, two) spatially-independent-from-one-another and collinearly-propagating transverse modes. The so generated higher-order transverse mode radiative output is then directed onto an astigmatic mode converter (AMC) system, if desired, to transform the lasing HG-modes to corresponding LG modes. All of the empirically-demonstrated transverse modes in the laser output produced by embodiments of the invention boasted Watt-level output powers.

Examples of the Laser System and Modelling of Higher-Order Hermite-Gaussian Modes Produced by Such Laser System.

An embodiment 100 of the laser system with a linear laser cavity 130 (employing the VECSEL chip as a laser gain medium 120) and an optional external astigmatic mode converter (AMC) 160 is schematically presented in FIG. 1. In a specific case, a spatially-curved output coupler (a laser cavity reflector) 110—with an approximately 250 mm radius of curvature and about 97% reflectance—was placed at a distance of about 270 mm away from the gain medium chip 120 (designed to operate at about 1068 nm), thereby defining the linear cavity 130 between a reflector formed by the chip 120 and the reflector 110, to cause a beam waist diameter of the fundamental Gaussian mode propagating intracavity to be about 340 µm.

In one implementation—as shown—to provide for pumping the gain medium 120, radiative (optical) outputs from two pump diodes were focused, as shown with 134A, 134B, to focal spots of about 380 µm diameter on the chip 120 (pump diodes are not shown; each operating at about 808 nm). Such first and second (multiple) pump channels 134A, 134B were appropriately configured to ensure that delivery of the pump energy to the corresponding locations on the chip 120 was spatially-reconfigurable. To this end, the embodiment 100 can be complemented with a mechanism or system that contains—in addition to coupling optics such as lenslets 138A, 138B, for example—optical fibers (not shown) that are disposed to deliver the beams 134A, 134B from the pump diodes to the focusing lenslets 138A, 138B to be refocused onto the chip 120, as well as appropriate micro-positioners (not shown) configured to change the locations and mutual orientations of the related components of the laser system 100.

As a result, the spots of irradiation provided by the pump beams 134A, 134B on the chip 120 are made to be repositionable. For example, both pump beams can be oriented to define the focal spots at the same location of the surface of the chip 120. In a specific case—when such pump location(s) substantially coincide(s) with or is at the center of curvature (COC) of the output coupler 110 at a surface of the chip 120—only the $HG_{0,0}$ transverse mode remained supported by the gain that results from the optical pumping, and the corresponding $HG_{0,0}$ transverse mode could be observed at the output 140 from the laser cavity 130. (In comparison, when these pump spots were displaced from the position of the center-of-curvature (COC) by respectively-corresponding certain distances, the higher order $K_{m,n}$ lasing modes could be induced as the output 140. In practice, as was empirically proven, the locations of the desired "pump spots" with respect to the axial point of the gain chip 120 could be substantially accurately determined based on the geometrical extent of the simulated desired HG-modes, shown below in reference to FIGS. 6 and 7.)

While the example of the laser system is discussed to be equipped with the optical pumping scheme, the skilled artisan will readily appreciate that the pumping mechanism can alternatively or in addition include electrical pumping, in which case the system such as system 100 can be complemented with the appropriately disposed electrodes in contact with the ship 120, which deliver electrical pump current to the chosen locations at the chip. (The locations of the electrical contacts between the electrodes and the chip 120 can be managed and changed with the use of appropriately configured mechanical repositioners, for example.)

When multiple electrical pumping schemes are used, instead, with the embodiment of the invention, the pumping electrical currents are applied at the judiciously chosen locations ("pump spots") of the VECSEL chip surface. These pump spots are defined with respect to the axial point of the chip surface at which the center of the curvature of the output coupler of the system is located. The application of the electrical pump current is carried out via appropriately configured electrodes in contact with the VECSEL's surface at these chosen locations, to gain control of the structure. Similarly, in embodiments where optical pumping beams are used, the optical beams delivering pump energy to the VECSEL chip are focused onto the VECSEL chip at judiciously chosen pump spots. By appropriately defining the position(s) of the focused spots of the VECSEL-pumping radiation with respect to the axial spot of the chip's surface (at which axial spot the center of curvature of the output coupler is located), the user achieves and realizes the control of the structure of the lasing transverse mode(s).

It is understood, therefore, that the embodiment 100 of the VECSEL-based laser system is configured to provide lasing output 140 having Hermite-Gaussian transverse mode profile(s), which transverse modes are further converted to Laguerre-Gaussian laser beam(s) 150 upon interaction with the AMC 160. The exact content of the transverse mode distribution at the location 140 was controlled by controlling the locations to which the pump energy was delivered to the gain medium chip 120. In one non-limiting implementation, the AMC 160 was constructed from two substantially identical cylindrical lens elements, 162A, 162B with substantially equal focal lengths of f=30 mm. (It will be appreciated that the mutual orientation of the lens elements can be chosen to be different from that schematically shown in FIG. 1, for example in order to reduce aberrations introduced into the propagating optical wavefront, with curved surfaces being outer surfaces of the AMC 160). The distance D between these lens elements is generally dependent on their focal lengths f and can be expressed as $$D = \frac{2f}{\sqrt{2}} \quad (1)$$

In one implementation, therefore, D~42 mm. Additionally, to improve the HG-to-LG mode conversion at the AMC 160, it may be preferred to refocus the incoming upon the AMC 160 beam 140, that has the HG transverse mode distribution of irradiance in a plane transverse to the axis 166, to have a certain pre-determined Rayleigh range $z_R$, where $$z_R = \left(1 + \frac{1}{\sqrt{2}}\right)f \quad (2)$$

and to have the beam waist of the beam 140 positioned substantially in or at the center of a gap between the constituent cylindrical lens elements 162A, 162B. To meet these conditions, and based on the initial Rayleigh range value of the incoming beam 140, an appropriate spherical lens 170 was chosen and disposed between the laser cavity 130 and the AMC 160. In one specific case, the focal length of the lens 170 was about 200 mm, and the lens 170 was positioned at about 180 mm behind the output coupler 110 and at about 390 mm in front of the first cylindrical lens 162A of the AMC 160. Moreover, in cases when it is preferred that the laser cavity output an HG-mode that is specifically oriented to have the axis of symmetry of the irradiance distribution (in the plane transverse to the axis 166, that is, the yz-plane of the local system of coordinates) oriented, for example, diagonally at about 45° with respect to the x-axis and the y-axis of the local coordinate system, the pair of lens elements 162A, 162B in the AMC 160 can be judiciously rotated by 45 degrees, accordingly. In this case, the system 100 may be additionally equipped with an appropriate rotational mechanism (not shown) operably cooperated with at least one of the lenslets 152A, 162B. The Laguerre-Gaussian mode orders $LG_p^l$ in the output 150, when obtained upon the transfer of the beam 140 through the AMC 160, are correlated to Hermite-Gaussian mode orders in the beam 140 as l=|n−m| and p=min(m,n) All of the lenses 162A, 162B, 170 were antireflection coated at the lasing wavelength (in this case—of about 1068 nm) and, therefore, the total loss introduced by the AMC 160 was assessed to be smaller than 0.5%. Notably, the laser cavity of the embodiment 100 did not contain any intracavity optical element configured s to introduce preferential optical loss to a given laser mode among the laser modes supported by such laser cavity.

In one embodiment, to fabricate a laser system a chip from a VECSEL wafer with strain-compensated InGaAs/GaAs/GaAsP multiple quantum well (MQW) heterostructure, designed for emission at about 1068 nm was used. The MQW heterostructure included 12 compressively strained 8-nm-thick InGaAs QWs with pump-absorbing GaAs barriers and GaAsP layer between each of two immediately-neighboring QWs for strain compensation purposes. A distributed Bragg reflector (DBR) stack contained 25 pairs of alternating AlGaAs/AlAs layers to form a substantially flat reflector and to provide high-reflectance (assessed at about 99.9%) at the emission wavelength. The wafer heterostructure was grown by the means of metal oxide chemical vapor deposition (MOCVD) process as a "bottom emitter", such that the active region was grown first on a GaAs substrate, following by the growth of a DBR layer. The composition and thickness of the gain region was designed such that each QW was positioned at the location of an antinode of a standing wave of the overall laser cavity, to specifically take advantage of resonant periodic gain.

Skilled artisans are well aware that the optimal thermal management is crucial to achieving efficient lasing and, therefore, the VECSEL chip has to be fabricated before being fully operational. Accordingly, chemical-vapor-deposited diamond member and the chip were coated with Ti/Au layers and indium-solder bonded together, to form a heat-distributing element. The GaAs substrate was removed with the use of selective chemical wet etching, which resulted in a substantially optically-flat surface of a bonded chip. The finished chip was mounted and clamped to a water-cooled copper heat sink and maintained at a temperature of 10° C.

According to one embodiment, the chip 120 was configured to provide a substantially spatially-flat reflector, in operation of the system, and the lasing cavity 130 was limited on the other side with a curved reflective surface of the mirror 110 having the radius of curvature R and disposed at a distance d from the chip 120. By virtue of the process of optical pumping (considered here as an example), the VECSEL chip 120 imparted gain to the circulating within the cavity 130 electromagnetic field that varied in the (x, y) plane transverse to the cavity axis z, 166. The two pump beams 134A, 134B were considered to have identical transverse profiles of irradiance that are symmetrically displaced with respect to the cavity axis. The spatially-dependent gain was then expressed as $$g(x, y) = \qquad (3)$$
$$g_1 \exp\left[-\frac{(x-L_x)^2}{x_{px}^2} - \frac{(y-L_y)^2}{w_{py}^2}\right] + g_2 \exp\left[-\frac{(x+L_x)^2}{w_{px}^2} - \frac{(y+L_y)^2}{w_{py}^2}\right]$$

Here, $w_{px}$ and $w_{py}$ are the pump spot sizes of the beams 134A, 134B at the surface of the chip 120 along their respective directions, and $L_x$ and $L_y$ denote the corresponding displacements of the pump beam centers from the axial point of the surface of the chip 120 (which axial point substantially coincides with the COC of the reflector 170). (In the case when the optical pump beams 134A, 135B were not normally incident onto the surface of the chip 120, the pump spots could be characterized by some degree of ellipticity on that surface, expressed via the $w_{px}$ and $w_{py}$ the pump spot extents.)

The quantity g(x, y) is the gain-length product, for the chip 120, where gain is induced by the pump beams 134A, 134B; and $g_1$ and $g_2$ denote peak values for each of the beams 134A, 134B. The net gain experienced by the circulating field after the reflection at the surface of the chip 120 is, then, $G(x, y)=e^{g(x,y)}$. Adopting a reference plane outside the chip 120 in FIG. 1, and considering the propagation of the field into the cavity defined between the surface of the chip 120 and the outer coupler 110 (which is a cavity external with respect to the cavity of the VECSEL gain chip), the wave optical equation describing successive round trips of the EM field in the cavity is given by $$E_{n+1}(x,y)=rG(x,y)\hat{K}E_n(x,y) \qquad (4),$$

where $\hat{K}$ is the Huygens integral operator for propagation around the external cavity, n counts the round trips, and r is the EM-field reflectivity value of the output coupler 170. Following the numerical approach for optically pumped lasers (discussed by Endo, Masamori in *Optics Express*, no. 9 (2004): 1959-1965; incorporated herein by reference), the Eq. (4) is iterated for a general initial field $E_0(x, y)$ until this Equation settles down to a steady-state field profile E(x, y): This yields the spatial profile of the oscillating laser mode with the maximum gain.

Additional wave optical simulations provide the calculated mode irradiance profile $|E(x, y)|^2$ for a variety of pump beam configurations. The passive cavity modes without gain may be expressed as $U_{m_x m_y}(x, y)=u_{m_x}(x)u_{m_y}(y)$, with $u_m(s)$ Hermite-Gaussian functions with respect to the x and y axes, and mode indices $m_{x,y}=0,1,2, \ldots$ These HG modes are based on the passive cavity Gaussian spot size $w_0$ as evaluated at the chip 120.

The discussed VECSEL system had low losses at the reflector(s) and, as a result, the required gain values were low: $g_{1,2} \ll 1$. Therefore, depending on the specific pump beam configuration (that is, the configuration described by a specific parameters of spatial displacement of the pump spots in the surface of the chip 120 with respect to the axis of the system), the lasing mode that enjoys the highest level of gain may be approximated by one of the HG modes $U_{m_x,m_y}(x,y)$, which is turn leads to the simple approximation for the spatially-averaged modal gain $$g_{m_x m_y} = \frac{\int_{-\infty}^{\infty}\int_{-\infty}^{\infty} g(x,y)|U_{m_x,m_y}(x,y)|^2 dxdy}{\int_{-\infty}^{\infty}\int_{-\infty}^{\infty} |U_{m_x,m_y}(x,y)|^2 dxdy}, \quad (5)$$

which depends on the pump beam configuration via Eq. (1).

Figure 2:
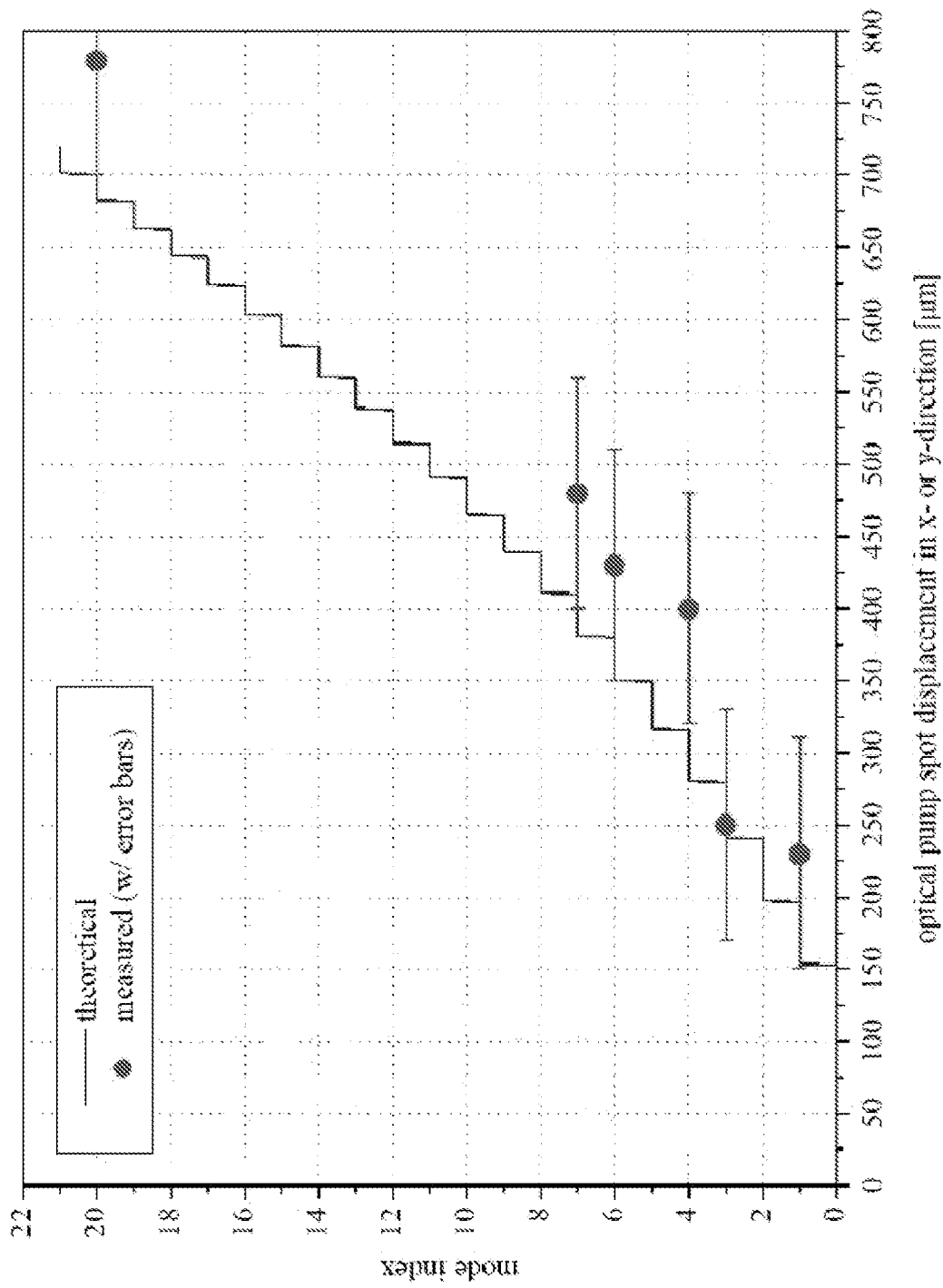
FIG. 2 is a plot depicting dependency of a mode index $m_y$ of maximum modal gain as a function of pump-beam displacement $L_y$ with respect to the optical axis.

In one example, a skilled person can consider the case of a single pump beam only—for example, beam 134A (that is, $g_2=0$)—with $w_0$, $w_{px}$, $w_{py}$=171, 180, 220 μm, respectively, and consider varying the pump displacement $L_y$ along the y-axis while keeping $L_x$=0. For this case, and keeping $m_x$=0, the modal gain for a given $L_y$ versus $m_y$ was calculated according to Eq. (3). The results are shown in FIG. 2, illustrating the mode index (that is, mode order) $m_y$ of a mode that has the highest gain (maximum modal gain) as a function of a pump-beam displacement $L_y$ in y-direction. As can be expected, the trend is that as the pump beam displacement from the COC of the reflector 170 at the ship 120 is increased, the oscillating laser mode of highest gain becomes a $HG_{0,m_y}$ mode with increasing mode index $m_y$. (Notably, these results apply in the case of displacement in the x-direction as well, which was quite accurately reproduced by the appropriate wave-optical simulations, including the jumps in lasing HG mode with pump beam displacement.

Figure 3:
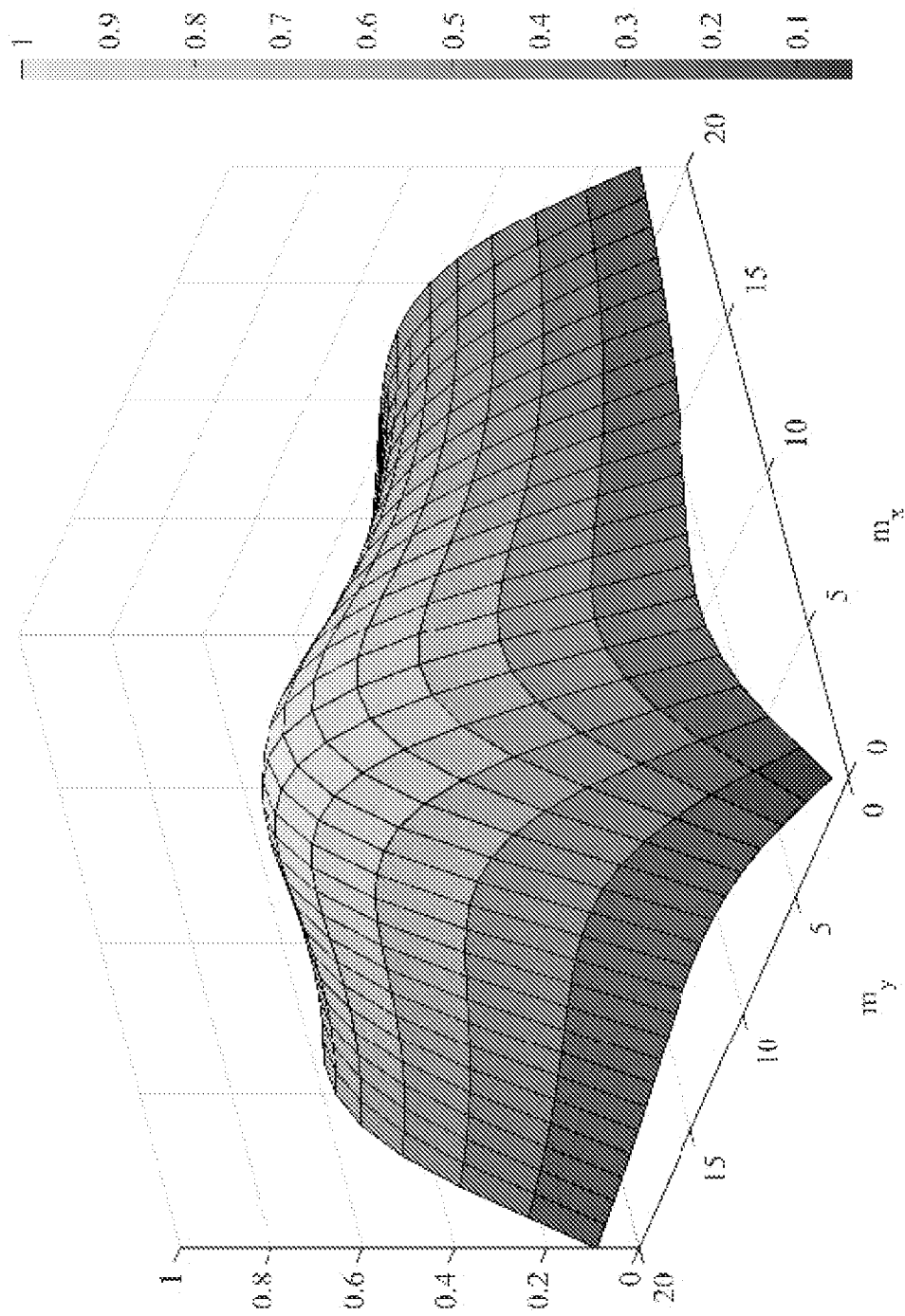
FIG. 3 is a surface plot illustrating the modal gain (obtained in the embodiment of the invention with two equal-power pump beams ($g_1=g_2$, and $L_x=360$ μm and $L_y=390$ μm) as a function of HG mode indices ($m_x$, $m_y$), with the maximum of the modal gain corresponding to $HG_{6,7}$ mode.

FIG. 3 is a surface plot representing the modal gain (along the z-axis of the plot) provided by the gain medium of the chip 120 pumped with the both pump beams 134A, 134B simultaneously (the beams having equal pumping power), $g_1=g_2$, with $L_x$=360 μm and $L_y$=390 μm. The modal gain is shown as a function of both HG mode indices ($m_x$, $m_y$). For this example, the highest modal gain appears for the $HG_{6,7}$ mode, thereby evidencing the capability of the multiple-pump configuration to generate a rich set of high-order HG modes. This inherent ability of the present embodiment to generate Hermite-Gaussian modes with variable parameters ($m_x$, $m_y$) was made possible due to the use of multiple pump beams and in clear contradistinction with the capabilities of the embodiments of related art (such as that described, for example, by Chu et al. in *Applied optics* 47, no. 14 (2008): 2583-2591, where a single pump beam was used in conjunction with the suitable positioning of an opaque wire).

In the following sections these results of the simplified analysis are referred to, to provide comparison with the results of experiments and also the simulation of optical waves.

Verification of Operability of Embodiments of the Invention

A variety of implementations, in which the optical pump spots at the chip 120 were changed during the operation of the laser system, were tested to demonstrate a broad range of obtainable higher-order Hermite-Gaussian modes. The output powers, optical spectra and images of transverse mode profiles were appropriately captured to demonstrate high quality of produced beams.

The change in supported higher-order transverse modes in the laser output in connection with displacement of the location of the optical pump delivery to the gain medium 120 was measured using images of the VECSEL chip surface. (To effectuate such change, the pump channels 134A, 134B were appropriately spatially displaced. The error margin for the displacement measurements was estimated to be about 80 μm. The collected data were plotted against the theoretical curve shown in FIG. 2. Based on these results, is the skilled person will readily appreciate that that experiments were in good agreement with the calculated theoretical trend.

Figure 4:
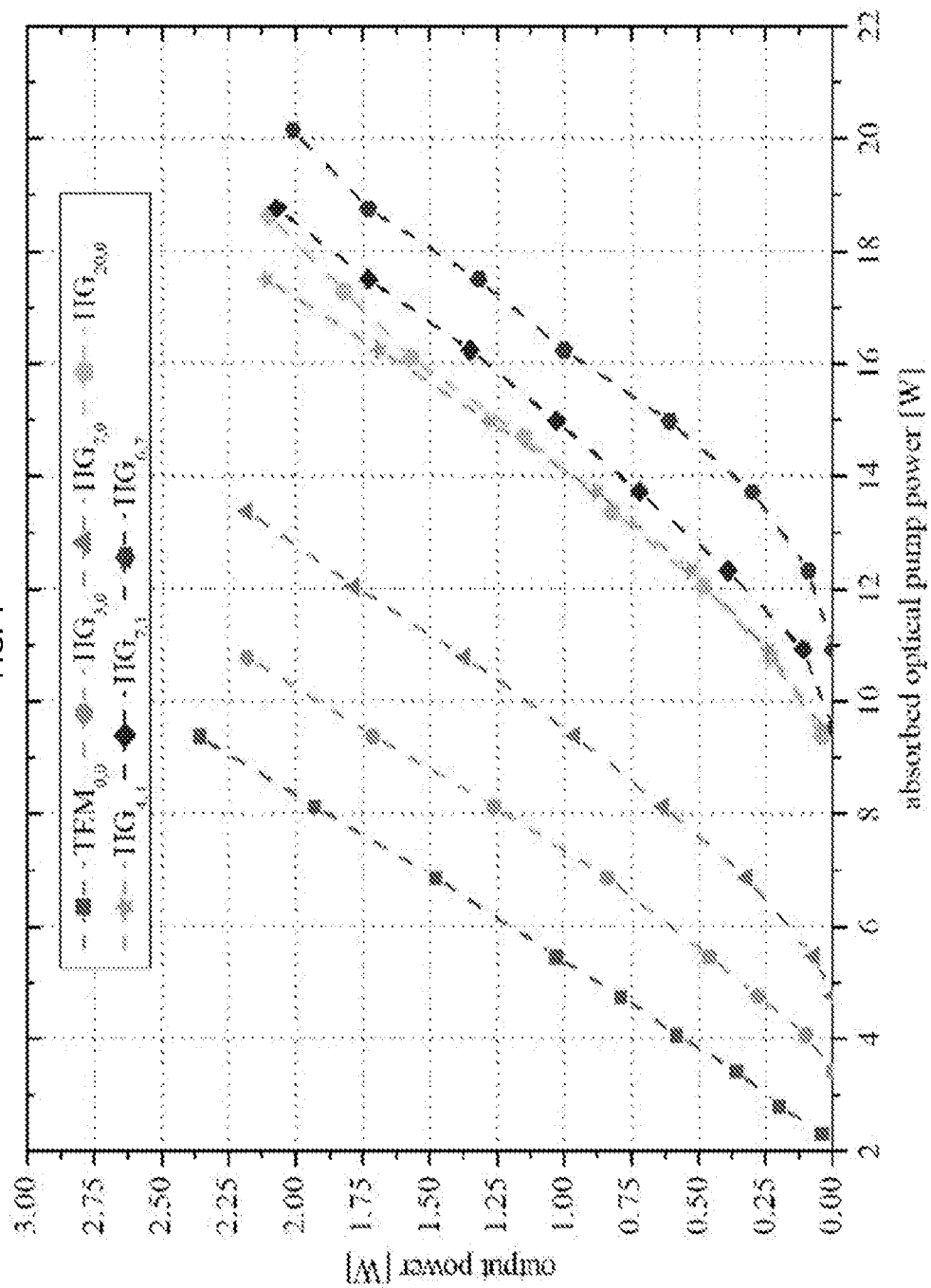
FIG. 4 shows plots of the output power of high order Hermite-Gaussian modes vs. optical pump power absorbed by the gain medium of the embodiment of the invention.
Figure 5:
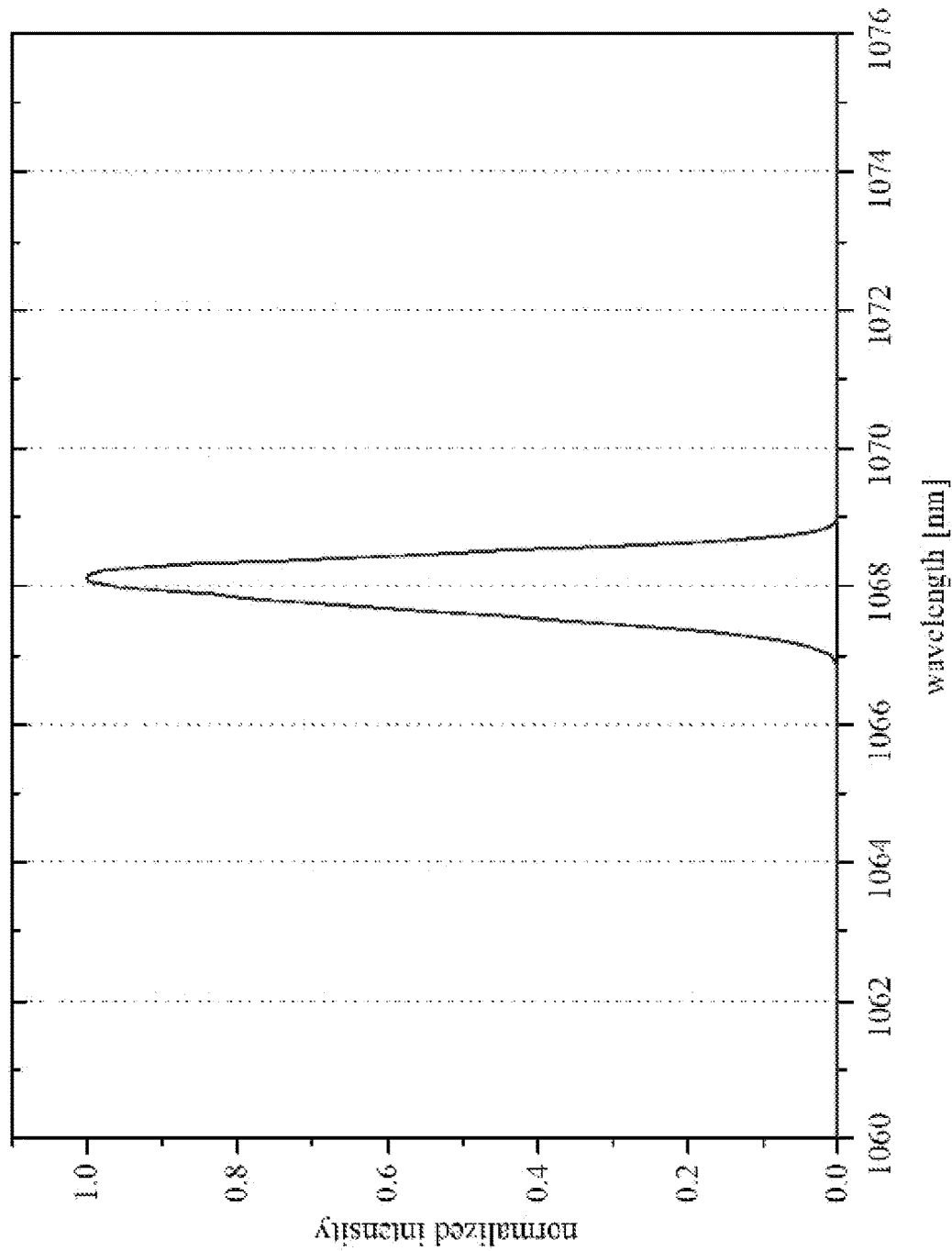
FIG. 5 illustrates the optical spectrum of high-order spatial lasing mode(s) produced with the laser apparatus configured according to the idea of the invention.

The output power characteristics for fundamental and higher order modes are compiled in FIG. 4. The measured powers of HG modes (present in the beam 140 before the AMC 160) and LG modes (present in the beam 150 after the laser output interacted with the AMC 160) are considered to be substantially equal, because the lenses 170, 162A, 162B used in the system did not introduce any significant optical loss. Here, the output power is plotted against the total absorbed optical pump power. The maximum output powers measured for $TEM_{00}$, $HG_{0,3}$, $HG_{0,7}$, $HG_{0,20}$, $HG_{4,4}$, $HG_{7,1}$, $HG_{6,7}$ modes and their LG-mode counterparts were 2.36 W, 2.18 W, 118 W, 2.1 W, 2.11 W, 2.07 W and 2.01 W, respectively. Similarly, the optical spectra for all the corresponding radiative outputs were captured using an optical spectrum analyzer and for all of the cases the emission wavelength remained around 1068 nm. A single-peak spectrum, representing the laser output 150 in substantially any transverse mode distribution, is demonstrated in FIG. 5.

To identify spatial profiles of the HG modes in the output 140, a scanning-slit DataRay BeamMap2 beam profiler was used, whereas for determination of the spatial profiles of the LG modes in the beam 150 a ThorLabs CCD camera was utilized to capture images of the transverse distribution of irradiance across the beam 150. FIGS. 6A, 6B, 6C, 6D, 6E, and 6F illustrate the diverse range of HG modes empirically measure along with their simulated counterparts. The experimentally-acquired profiles of HG modes clearly match the ones computed in a simulation. FIGS. 7A, 7B, 7C, 7D, 7E, and 7F present HG modes and the corresponding LG modes into which the HG modes were converted with the use of the AMC 160.

The images of HG and LG modes demonstrate the high quality of the generated transverse modes and efficient conversion of axially symmetric HG modes into ones of circular symmetry (LG modes).

Figure 8A:
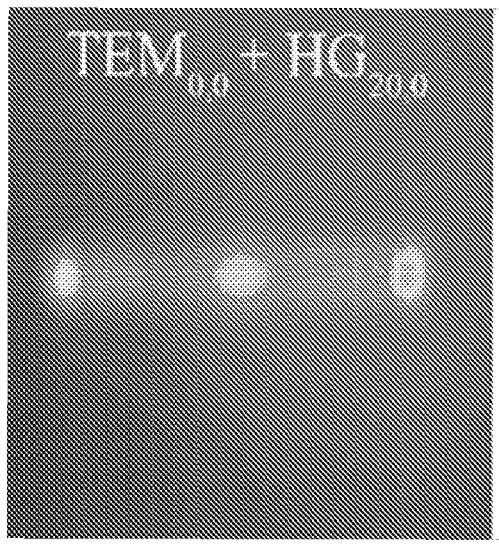
FIGS. 8A, 8B and 9A, 9B provide experimentally-acquired optical images characterizing transverse mode content of a laser beam generated by the embodiment of the invention: before the astigmatic mode converter (HG modes) and after the astigmatic mode converter (LG modes), and evidences that the spatially-reconfigurable optical pump channels employed in the embodiment enable lasing operation with independent, simultaneously generated, and collinearly propagating HG modes (and, optionally, LG modes).
Figure 8B:
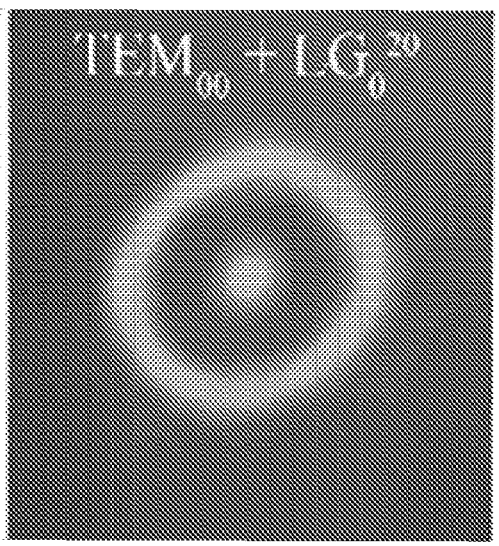
Figure 9A:
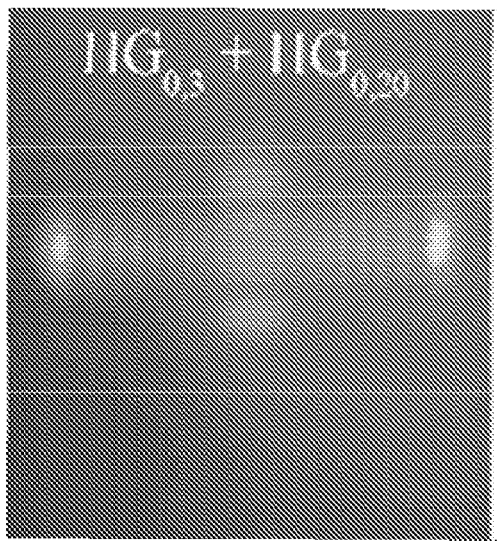
Figure 9B:
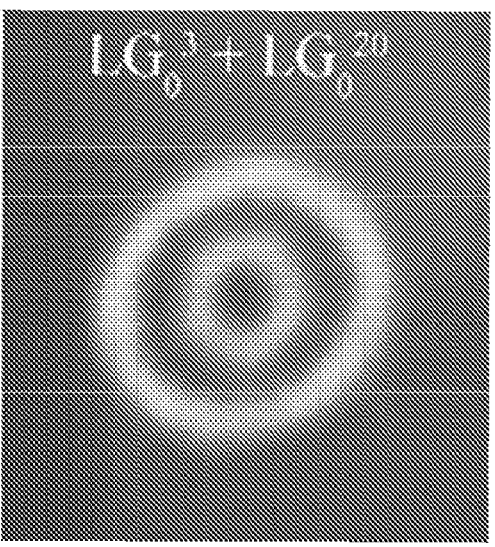

To further demonstrate the uniqueness of the embodiment of the invention, the system 100 was operated to achieve the simultaneous lasing of two different order transverse modes, see FIGS. 8A, 9A. With the use of the first and second spatially-repositionable (with respect to the gain medium chip 120) optical pumps 134A, 134B, independing lasing in two transverse modes was made viable: as shown in FIGS. 8A, 8B, the simultaneously generated at the output of the laser cavity transverse modes $TEM_{0,0}$ and $HG_{20,0}$ were transformed into the combination of the $TEM_{0,0}$ and $LG_0^{20}$ as a result of interaction with the AMC 160. Similarly, in a related experiment, as a result of spatial repositioning of the optical pumps 134A, 134B with respect to he axial point of the chip 120, the generated combination of transverse modes was changes from $TEM_{0,0}$ and $HG_{20,0}$ to $HG_{3,0}$ and $HG_{0,20}$; which were further transformed to the combination of $LG_0^3$ and $LG_0^{20}$ as a result of interaction with the AMC 160 (*see FIGS. 9A, 9B). Such operational situation is simply not possible (cannot be achieved) with the laser systems of related art that utilize intracavity mode control elements. In practice, the order of the generated modes can be controlled independently by the spatial displacement of each pump with respect to the chip 120. The laser beams carrying the $TEM_{00}$ and $HG_{0,20}$ modes are collinearly-propagating (and can be viewed as a single beam 140 at the output from the laser cavity). Similarly, the laser beams carrying the $HG_{3,0}$ and $HG_{0,20}$ modes are also collinear (and aggregately form a beam 140). The converted with the use of AMC 160 higher-order LG-modes are propagating along the same direction (substantially along the laser cavity axis 166) The collinearity of the portions of the laser output carrying respective transverse modes is clearly noticeable when looking at corresponding LG modes pairs. A skilled artisan familiar with related art will immediately appreciate that such beams cannot be obtained with other means and do not have their single LG mode-containing counterparts.

Overall, disclosed are the design; theoretical simulations and experimental results of a single-chip linear cavity VECSEL-based laser system, which incorporates multiple spatially-reconfigurable optical (or electrical) pumps and no intracavity elements to changeably (tunably) generate a wide range of Hermite-Gaussian transverse modes at a chosen wavelength. (Depending on specific implementation of the idea of the invention, the operational wavelengths of the system include the 940 nm band, the 980 nm band, the 1068 nm bands, and the 1180 nm band of wavelengths, as non-limiting examples.) An astigmatic mode converter, which can optionally be used, was mode-matched to the linear laser resonator for efficient and changeable—at user's discretion—generation of Laguerre-Gaussian transverse modes.

While only several higher-order modes were showcased, it was experimentally verified that the proposed configuration allowed for smooth transition between many modal orders. One of practical advantages of the proposed VECSEL-based multi-pump laser system is the capability of lasing operation with two collinear, simultaneous, and independent laser beam carrying, respectively, HG modes of different orders. The irradiances of such beams can be controlled separately and independently from one another, which is not feasible by other means (such as the use of intracavity optical elements—such as opaque wires—in the systems of related art). This design allows for great flexibility of beam shaping, whether axially or circularly symmetric transverse modes are demanded. In case of beams carrying angular momentum, the l-number values can be precisely adjusted, which is of great importance for applications such as atom and particle trapping.

Moreover, the implementation of the idea of the invention imposes no restrictions that would limit the number of pumping channels to two (that were discussed above), and more pumping channels could be used to generate multiple higher-order HG modes (and—if the orientation between transverse modes and AMC requirement is fulfilled—efficient conversion to corresponding LG modes can occur). Accordingly, in a related embodiment a laser system may be configured to include several pairs of pump channels, each configured to deliver corresponding pumping energy to the laser gain medium chip at a respectively-corresponding location in a fashion that allows for spatially-varying such location.

A simplified schematic of the methodology for operating of an embodiment of the laser system of the invention is presented in FIG. 10. Here, at step 1010 the radiative output is generated from the laser contained in the linear laser cavity as a result of pumping at least first and second (and, optionally simultaneously—third and fourth) pump energies to the laser gain medium chip at respectively-corresponding first, second, third, and fourth locations at the chip. The so-generated radiative output contains at least one high-order HG-mode (and, in case of four pump energies being used—at least two high-order HG modes that are difference from one another). The utilized pump energies may be optical (delivered via an optical beam) or electrical (delivered with current, for example). At step 1020, the so-generated radiative output is transmitted through the AMC system outside the linear laser cavity to convert the present high-order HG modes to corresponding LG-modes such as to change the transverse mode content of the laser beam between the laser cavity and the output plane of the overall laser system. Between the steps 1010 and 1020, the user may decide to implement the modification of the multiple pump channels of the laser system such as to change distances separating at least one of the first, second, third, and fourth locations from the point of the laser gain medium chip located at the laser cavity axis. (If chosen, such modifications are carried out at steps 1014 and/or 1018.) Following or simultaneously with (or even prior to) the transformation of the transverse mode content of the laser beam at step 1020, at least one of the changes can be introduced to the laser system in order to modify the HG-mode content of the radiative output at step 1030 such as to change the order of the first HG-mode independently from changing (or maintaining unchanged) the order of the second HG-mode. Accompanying such modifications of the HG-mode content at the output of the linear laser cavity are the corresponding modifications of the LG-mode content of the overall laser system output. These operational changes include the modification of at least one of the separations between the first, second, third, and/or fourth locations and the laser cavity axis and the variation of the at least one of the first, second, third, and/or fourth pump energies. Optionally, at step 1024, at least one lens component of the AMC system can be rotated about the axis of the laser cavity to rotate the HG-mode in a plane transverse to the axis.

With the use of this methodology, complex beam profiles (that are very difficult or impossible to generate with the systems of related art) could be easily formed. Alternatively or in addition, complementary multiple pump channels can be used to provide more gain to the same transverse mode, thus increasing maximum output power. Based on the performed experimental verification, the maximum available transverse mode order at the output of the embodiment of the laser system is only limited by the size (aperture) of a used VECSEL chip and the output mirror 110. This structural advantage, combined with flexible design of VECSEL heterostructure and free-space cavity 130, leads to obtaining a very broad range of higher-order transverse modes or combination of such modes at a wide spectrum of wavelengths. Further, the proposed methodology can be employed with a cavity structured for mode-locking, wavelength tuning, or nonlinear frequency conversion operation(s), thus expanding the variety of applications even further.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself Even if not shown in the drawings expressly, an embodiment of the system of the invention may include programmable electronic circuitry (for example, a computer processor; see FIG. 1) controlled by instructions stored in a memory, to perform governing of the operation of the described laser system (in particular—of repositioning and/or reorienting of the pump channels with respect to the laser system) and/or specific data collection (for example, produced by an optical detector unit at the output of the system) and/or data-processing steps. The memory may be random access memory (RAM), read-only memory (ROM), flash memory or any other memory, or combination thereof, suitable for storing control software or other instructions and data. Those skilled in the art would readily appreciate that instructions or programs defining the operation of the present invention may be delivered to a processor in many forms, including, but not limited to, information permanently stored on non-writable storage media (e.g. read-only memory devices within a computer, such as ROM, or devices readable by a computer I/O attachment; such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement a method of the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The idea and implementation of the idea of the present invention opens the door to obtaining high-power high-order HG and/or LG laser modes, which opens the path to, for example, producing circularly symmetric transverse modes not only at the fundamental lasing frequency but also at multiple wavelengths by the means of nonlinear frequency conversion. The currently limited availability of higher order transverse modes in spectral regions such as UV, visible or mid-IR is, therefore, greatly expanded. Thus, the laser systems configured according to the idea of the invention, thanks to their flexibility and opportunities for customization, can be implemented when laser beams with particular orbital angular momentum are required for manipulation of atoms and/or particles.

The invention as recited in claims appended to this disclosure is intended to be assessed in light of the disclosure as a whole. Various changes in the details, steps and components that have been described may be made by those skilled in the art within the principles and scope of the invention.

LIST OF REFERENCE NUMERALS

100 laser system
110 output (first) reflector of a linear laser cavity
120 gain medium forming the second reflector of the linear laser cavity
130 linear laser cavity
134A, 134B pumping channels (shown to employ optical beams)
138A, 138B lenslets or lens elements
140 radiative output from the linear laser cavity, laser beam at the output from the linear laser cavity
160 astigmatic mode converter disposed externally with respect to linear laser cavity
162A, 162B constituent lens elements of astigmatic mode converter
150 radiative output (laser beam) from the laser system
170 lens
1010, 1014, 1018, 1020, 1024, 1030 steps of method for operating the laser system

The invention claimed is:

1. A laser system, comprising:
   a single linear laser cavity having a single laser cavity axis and extent limited by first and second reflectors;
   a single laser gain medium chip containing said first reflector;
   the second reflector having a single curvature and dimensioned to have a center of said single curvature of the second reflector at an axial point of the first reflector that is defined by said single laser cavity axis;
   multiple pump channels configured to deliver pumping energy to said single laser gain medium chip at respectively-corresponding multiple initial locations of a surface of said one laser gain medium chip in a fashion that allows for spatially-varying said multiple initial locations; and
   a first mechanism configured to cause, during the operation of the laser system, a change of
   a) a first location from said multiple initial locations at the surface of the single laser gain medium chip, to which the pumping energy is delivered through a chosen first pump channel of the multiple pump channels, to a respectively-corresponding second location at said surface to which said pumping energy is delivered through said chosen first pump channel, and
   b) a second location from said multiple initial locations at said surface, to which the pumping energy is delivered through a chosen second pump channel of the multiple pump channels, to a respectively-corresponding fourth location at said surface to which said pumping energy is delivered through said chosen second pump channel,
   to generate a single output beam of laser radiation in a high-order Hermite-Gaussian transverse mode through said second reflector.

2. The laser system according to claim 1, further comprising an astigmatic mode converter (AMC) system outside of the laser cavity on the laser cavity axis.

3. The laser system according to claim 2, wherein the AMC system is configured to have at least one of optical elements of the AMC system to be rotated about the laser cavity axis.

4. The laser system according to claim 1, wherein at least one of the following conditions is satisfied:
   a) the first and third of said multiple initial locations are positioned in said surface symmetrically with respect to the laser axis; and
   b) the second and fourth locations are positioned in said surface symmetrically with respect to the laser cavity axis.

5. The laser system according to claim 1,
   wherein a number of said multiple initial locations is even, and
   wherein said multiple initial locations form pairs of initial locations, initial locations in a first pair are defined on a first axis, initial locations in a second pair are defined on a second axis, the first and second axes being transverse to one another.

6. The laser system according to claim 5, wherein the first and second axes are perpendicular to one another.

7. The laser system according to claim 5, further comprising
   a second mechanism configured to re-orient said multiple pump channels to change at least one of
   i) a first spatial separation between the axial point of the first reflector and at least one of locations in the first pair; and
   ii) a second spatial separation between the axial point of the first reflector and at least one of locations in the second pair independently from one another.

8. The laser system according to claim 1, said laser system being devoid of an intracavity optical element that is configured to introduce preferential optical loss to a given laser mode supported by said laser cavity.

9. The laser system according to claim 1, wherein the first reflector is a distributed Bragg reflector (DBR) of the laser gain medium chip.

10. The laser system according to claim 1, wherein said laser cavity does not contain any intracavity element.

11. A laser system, comprising:
    a single linear laser cavity having a single laser cavity axis and extent limited by first and second reflectors;
    a laser gain medium chip containing said first reflector;
    the second reflector having a single curvature and dimensioned to have a center of said single curvature of the second reflector an axial point of the first reflector at an axial point of the first reflector that is defined by said single laser cavity axis;
    multiple pump channels, each of the multiple pumps channels configured to deliver pumping energy to the laser gain medium chip at a respectively-corresponding spatially-variable location of a surface of the laser gain medium chip, to generate through said second reflector a single output beam of laser radiation in a high-order Hermite-Gaussian transverse mode,
    wherein a number of multiple locations defined by said multiple pump channels is even,
    wherein said multiple initial locations form pairs of initial locations, initial locations in a first pair are defined on a first axis, initial locations in a second pair are defined on a second axis, the first and second axes being transverse to one another.

12. The laser system according to claim 11, further comprising an astigmatic mode converter (AMC) system outside of the laser cavity on the laser cavity axis.

13. The laser system according to claim 12, wherein the AMC system is configured to have at least one of optical elements of the AMC system to be rotated about the laser cavity axis.

14. The laser system according to claim 11, wherein the first and second axes are perpendicular to one another.

15. The laser system according to claim 11, further comprising
    a mechanism configured to re-orient said multiple pump channels to change at least one of
    i) a first spatial separation between the axial point of the first reflector and at least one of locations in the first pair; and
    ii) a second spatial separation between the axial point of the first reflector and at least one of locations in the second pair independently from one another.

16. The laser system according to claim 11, said laser system being devoid of an intracavity optical element that is configured to introduce preferential optical loss to a given laser mode supported by said laser cavity.

17. The laser system according to claim 11, wherein the first reflector is a distributed Bragg reflector (DBR) of the laser gain medium chip.

18. The laser system according to claim 11, wherein at least one of the following conditions is satisfied:
    a) the first and second of said multiple initial locations are positioned in said surface symmetrically with respect to the single laser axis; and
    b) the third and fourth locations are positioned in said surface symmetrically with respect to the single laser cavity axis.

* * * * *